(12) United States Patent
Lee

(10) Patent No.: US 6,722,419 B1
(45) Date of Patent: Apr. 20, 2004

(54) COMPUTER COOLER

(76) Inventor: Cheng-Ping Lee, No. 17, Jian San Rd., Junghe City, Taipei Hsien (TW)

( * ) Notice: Subject to any disclaimer, the term of this patent is extended or adjusted under 35 U.S.C. 154(b) by 0 days.

(21) Appl. No.: 10/447,147

(22) Filed: May 29, 2003

(51) Int. Cl.[7] .................................................. F28F 7/00
(52) U.S. Cl. ...................... 165/80.3; 165/185; 361/697; 361/704; 257/706; 174/16.3
(58) Field of Search ................................ 165/80.3, 185; 361/702, 703, 704, 697, 711; 174/16.3; 257/706

(56) References Cited

U.S. PATENT DOCUMENTS

| | | | | |
|---|---|---|---|---|
| 3,992,653 A | * | 11/1976 | Richardson et al. | ........ 361/707 |
| 5,542,176 A | * | 8/1996 | Serizawa et al. | ........ 29/890.03 |
| 6,199,627 B1 | * | 3/2001 | Wang | .......................... 165/185 |
| 6,324,061 B1 | * | 11/2001 | Kinoshita et al. | ............ 361/709 |
| 2002/0020523 A1 | * | 2/2002 | Sheu | ............................. 165/185 |

* cited by examiner

*Primary Examiner*—Terrell Mckinnon

(57) ABSTRACT

A computer cooler fixed on top of CPU for dissipating heat generated by CPU includes at least a base whose bottom surface is connected with upper surface of CPU and a plurality of cooling fins positioned on top of the base. The invention features on that the cooling fins are made of thin metal plate, then rivet two cooling fins with a metal bar to form a fin unit which can be inserted into parallel slots mounted on the top of the base. The parallel slot has a width equivalent to or slight narrower than the thickness of the fin unit. According to the above structure, the components can be assembled easily, processed conveniently. The density of fins is also increased and the heat dissipating efficiency is improved.

2 Claims, 4 Drawing Sheets

COMPUTER COOLER

BACKGROUND OF THE INVENTION

1. Field of the Invention

The invention relates to a computer cooler, especially to a cooler for computer CPU that can be easily assembled and convenient for fins and base processing so as to decrease the manufacturing cost and increase the quantity of cooler fins. Thus the heat dissipating area is increased and the cooling performance is improved.

2. Description of the Prior Art

The traditional cooler 1, as shown in FIG. 4, includes a base 10, a plurality of cooler fins 20 disposed on top of the base 10. The fin 20 is made by continuous folding of thin increase plate, and is surrounded by a frame 30 that is fixed on the base 10 so as to install a fan 40 on top of the base 10. By the contact between the central bottom area of the base 10 and the CPU (central processing unit) 50 on motherboard, the heat generated by CPU can be transmitted to fins and blasted off by the fan 40.

Because the traditional cooler fin 20 is made by continuous folding of the metal plate which forms continuous "U" and reverse "U" shapes at the upper and bottom side thereof. At the upper side, the reverse "U" shape forms an resistant surface 21 thus blocks half of the wind flow from the fan 40 and causes a very loud noise. On the other hand, only one side of the fin 20 contacts with wind flow (as the arrow shown in the figure for indicating the wind flow). The density of fins 20 made of folding metal plate can't be increased for enlarging the heat dispensing area. Furthermore, conventionally the fins 20 and the base 10 are combined by adhesive with each other that results less robustness and less efficiency of thermo conductivity, and no better heat dispensing efficiency.

SUMMARY OF THE INVENTION

Based on the disadvantages of above-mentioned cooler that has low density of fins, less stability in structure, and bad thermo conductivity, it is therefore a primary object of the present invention to provide a computer cooler which is convenient for the processing and assembling of the base and the fins. And the present invention has the better robustness, higher conductivity, and high density of fins so as to improve the heat dissipating efficiency.

In order to meet above purpose, a cooler with a plurality of fins made of thin metal plate is provided. A pair of fins is riveted by a metal bar so as to form a fin unit. And several parallel slots with a width equivalent to or a bit narrower than the thickness of the fin unit is arranged on the top of the base so that the fin unit can be inserted into each of the slots and fixed on top of the base respectively.

Based on the structure mentioned above, each of the slots on the base can be inserted with two fins, hence slot processing will be more convenient and overhead saving. And the wider width of the slot causes easier processing and cost reducing. Whereas, cooler fins were made piece by piece by pressing in order to save labor cost and material usage. When in assemble rivet two cooling fins with one metal bar into a unique fin unit, then the fin unit is inserted into the base slots so as to make assemble conveniently and increase fin quantity density to gain the purpose of heat dispensing efficiently.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DETAILED DESCRIPTION OF THE PREFERRED EMBODIMENT

Figure 1:
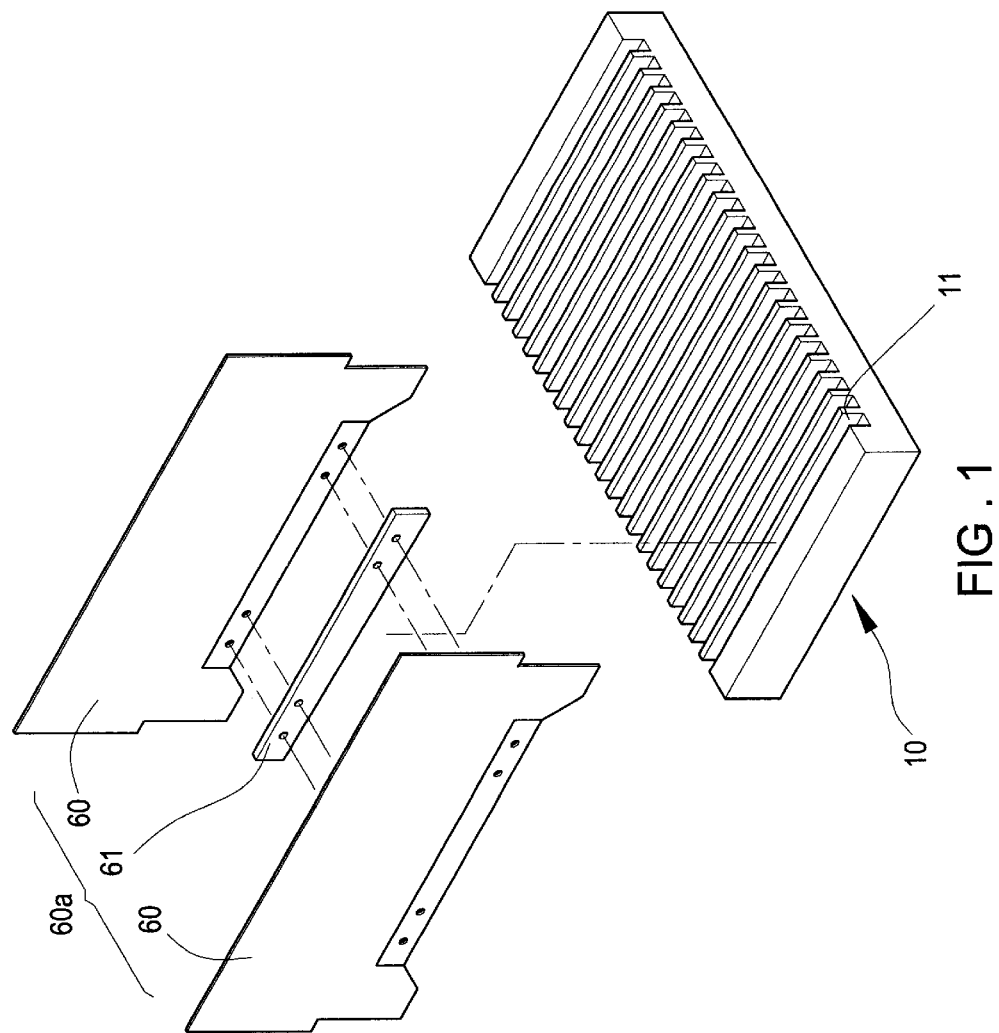
FIG. 1 is an explosive view of the present invention.
Figure 2:
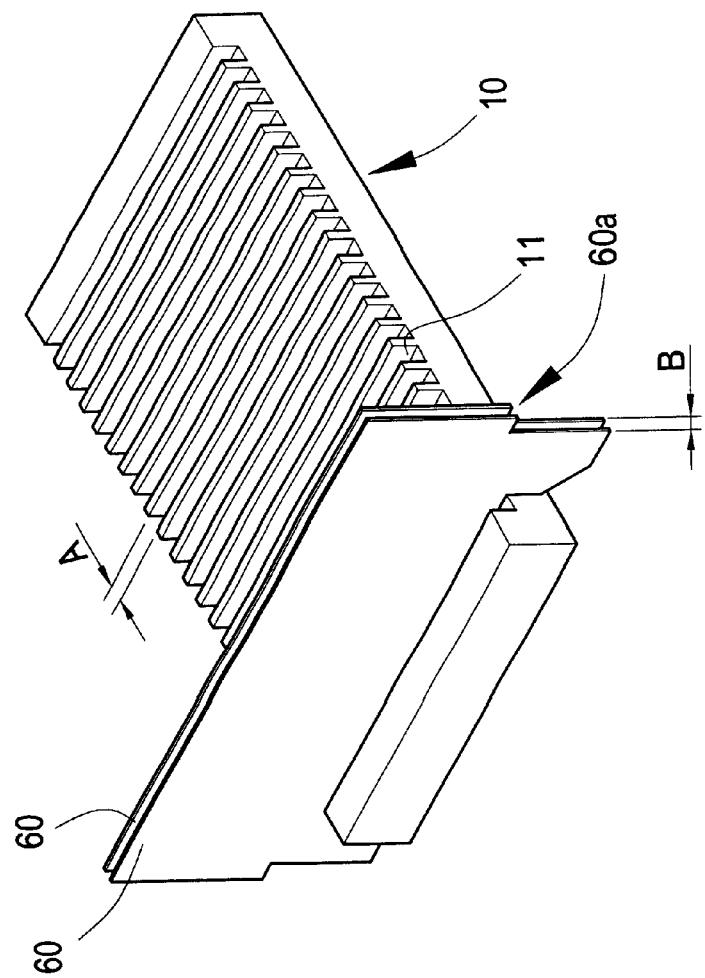
FIG. 2 is an assembling view of the present invention.
Figure 3:
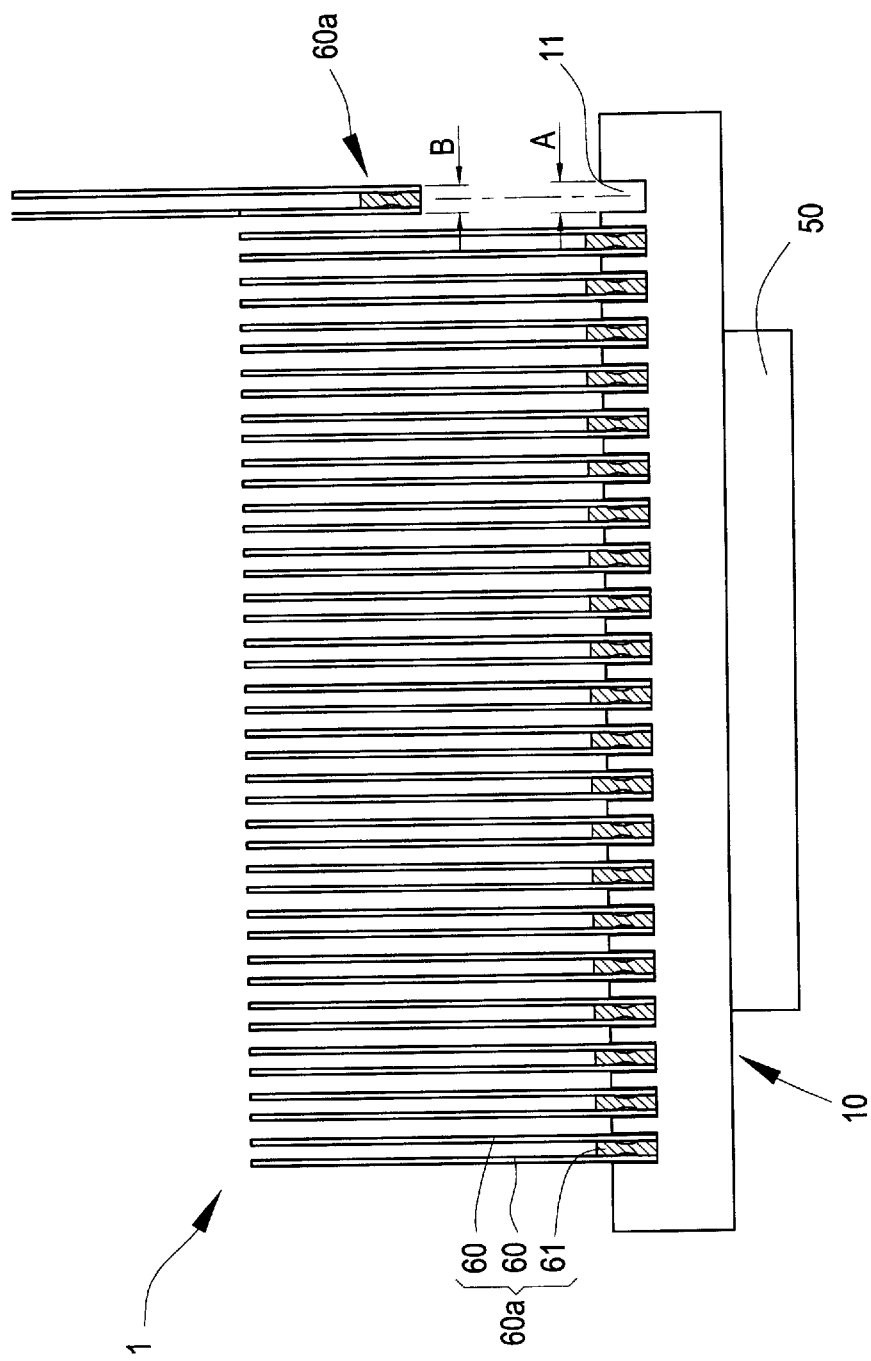
FIG. 3 is a cross-sectional view of an embodiment of the present invention.
Figure 4:
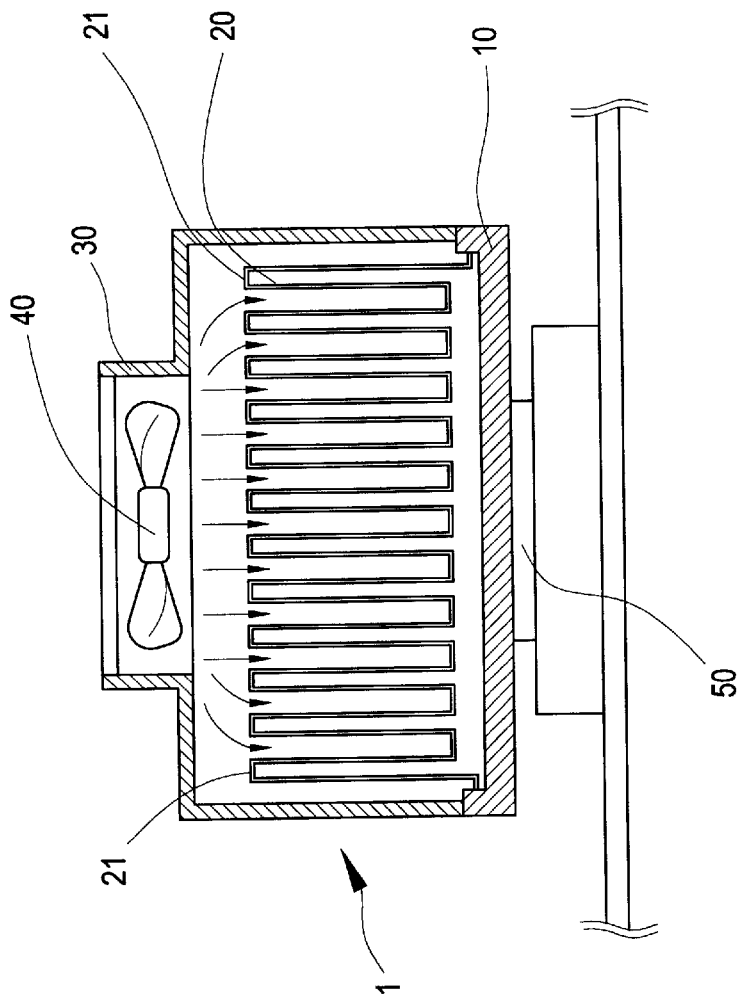
FIG. 4 is an assembling view of a prior art.

Please refer to FIG. 1 and FIG. 3, the present invention is fixed on top of the CPU 50 for dissipating heat generating thereby. The cooler 1 is composed of at least a base 10 which is connected with the upper surface of CPU 50 and a plurality of cooling fins 60 (as shown in FIG.3) positioned on the top of the base 10. The device features on that the cooling fins 60 of computer cooler 1 are made of thin metal plate. A pair of cooling fins 60 are riveted with one metal bar 61 on the bottom side thereof thus forms a fin unit 60a. A plurality of parallel slots 11 are positioned on top of the base 10 with a width (A) equivalent to or slight narrower than the thickness (B) of the fin unit 60a. The fin units 60a are inserted into each of the slots 11 piece by piece.

According to the structure above-mentioned, the metal bar 61 could be made from aluminum. Because of the soft characteristic of aluminum, when the fin units 60a are enforced into the slot 11 by press respectively, then the two fins 60 contact the wall of the slots in the base 10 closely. Thus the stability and the conductivity of the device are improved.

In accordance with the structure mentioned above, each of the slots 11 is positioned with at least two fins 60 thus the processing for slot 11 will be more convenient and overhead saving. Moreover, the width of the slots 11 is wider than that of the prior art for a single fin so as to make easier assembling and lower manufacturing cost. Furthermore, each of the fins 60 is produced by pressing that can save labor cost and material. When being assembled, the bottom sides of the two cooling fins 60 are riveted on the metal bar 61 for being integrated into a unique fin unit 60a, then the fin unit 60a is inserted into the slots 11 on the base 10 by press for closely connection with the slots 11. Because each of the slot 11 is positioned with a pair of fins 60 so that the density of the fins 60 is increased, thus the heat dissipating area is also enlarged and heat consumption efficiency is improved.

It should be noted that the above description and accompanying drawings are only used to illustrate some embodiments of the present invention, not intended to limit the scope thereof. Any modification of the embodiments should fall within the scope of the present invention.

What is claimed is:

1. A cooler disposed on computer motherboard for CPU heat dissipation comprising a base contacting the top of the CPU, A plurality of fins arranged on top of the base;

the cooler is characterized in that:

the fin is made of metal plate, and a pair of fins are riveted by a metal bar on the bottom sides thereof so as to form a fin unit; a plurality of parallel slots are mounted on top of the base whose width is equal to or a bit smaller than the width of the fin unit; each of the fin units is inserted firmly into each of the slots on the base respectively.

2. The cooler as claimed in claim 1, wherein the metal bar is made of aluminum.

* * * * *